United States Patent
Li et al.

(10) Patent No.: US 8,883,621 B2
(45) Date of Patent: Nov. 11, 2014

(54) SEMICONDUCTOR STRUCTURE AND METHOD OF FABRICATING MOS DEVICE

(71) Applicant: United Microelectronics Corp., Hsinchu (TW)

(72) Inventors: Chia-Jung Li, Tainan (TW); Po-Chao Tsao, New Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/728,611

(22) Filed: Dec. 27, 2012

(65) Prior Publication Data

US 2014/0183665 A1 Jul. 3, 2014

(51) Int. Cl.
| | | |
|---|---|---|
| *H01L 21/8238* | (2006.01) | |
| *H01L 21/336* | (2006.01) | |
| *H01L 29/49* | (2006.01) | |
| *H01L 29/78* | (2006.01) | |
| *H01L 27/06* | (2006.01) | |
| *H01L 21/8234* | (2006.01) | |

(52) U.S. Cl.
CPC ............... *H01L 29/49* (2013.01); *H01L 29/78* (2013.01); *H01L 21/82385* (2013.01); *H01L 27/0629* (2013.01); *H01L 21/82345* (2013.01)
USPC ........... 438/585; 438/299; 438/586; 257/288; 257/334; 257/369; 257/412; 257/E21.19; 257/E21.409; 257/E21.635; 257/E27.016

(58) Field of Classification Search
CPC ... H01L 29/49; H01L 29/78; H01L 21/82385; H01L 21/82345; H01L 27/0629

USPC .......... 438/299, 585, 586; 257/288, 334, 369, 257/412, E21.19, E21.409, E21.635, 257/E27.016

See application file for complete search history.

(56) References Cited

U.S. PATENT DOCUMENTS

| | | | |
|---|---|---|---|
| 6,855,607 | B2 | 2/2005 | Achuthan et al. |
| 7,013,446 | B2 | 3/2006 | Ohba et al. |
| 7,112,495 | B2 | 9/2006 | Ko et al. |
| 7,250,658 | B2 | 7/2007 | Doris et al. |
| 7,521,324 | B2 | 4/2009 | Ohmi et al. |
| 7,531,437 | B2 | 5/2009 | Brask et al. |
| 7,592,270 | B2 | 9/2009 | Teo et al. |
| 8,039,388 | B1 | 10/2011 | Ng et al. |
| 2007/0015365 | A1 | 1/2007 | Chen et al. |
| 2007/0072376 | A1 | 3/2007 | Chen et al. |
| 2007/0218661 | A1 | 9/2007 | Shroff et al. |
| 2008/0061366 | A1 | 3/2008 | Liu et al. |
| 2009/0057759 | A1 | 3/2009 | Obradovic et al. |
| 2009/0124097 | A1 | 5/2009 | Cheng |
| 2009/0200494 | A1 | 8/2009 | Hatem et al. |
| 2010/0044783 | A1 | 2/2010 | Chuang et al. |

(Continued)

*Primary Examiner* — Dao H Nguyen
(74) *Attorney, Agent, or Firm* — J.C. Patents (57) ABSTRACT

Provided is a semiconductor structure including a gate structure, a first spacer, and a second spacer. The gate structure is formed on a substrate and includes a gate material layer, a first hard mask layer disposed on the gate material layer, and a second hard mask layer disposed on the first hard mask layer. The first spacer is disposed on sidewalls of the gate structure. The second spacer is disposed adjacent to the first spacer. The etch rate of the first hard mask layer, the etch rate of the first spacer, and the etch rate of the second spacer are substantially the same and significantly smaller than the etch rate of the second hard mask layer in a rinsing solution.

8 Claims, 7 Drawing Sheets

(56) References Cited

U.S. PATENT DOCUMENTS

| | | |
|---|---|---|
| 2010/0048027 A1 | 2/2010 | Cheng et al. |
| 2010/0087055 A1* | 4/2010 | Lai et al. .................. 438/585 |
| 2010/0129994 A1 | 5/2010 | Awad et al. |
| 2012/0094459 A1* | 4/2012 | Park et al. .................. 438/299 |
| 2013/0288471 A1* | 10/2013 | Chi .................. 438/586 |
| 2014/0004677 A1* | 1/2014 | Li et al. .................. 438/299 |

* cited by examiner

SEMICONDUCTOR STRUCTURE AND METHOD OF FABRICATING MOS DEVICE

BACKGROUND

1. Technical Field

The present invention relates to a semiconductor structure and a method of fabricating MOS device.

2. Description of Related Art

Metal oxide semiconductor field effect transistor (MOSFET) is a basic structure widely applied to various semiconductor devices such as memory devices, image sensors, and display devices. To meet the demand of lighter, thinner, and smaller electronic devices, the size of CMOS is continuously shrunk. Accompanying the miniaturization also comes various techniques for improving the carrier conductivity of the channel of a MOSFET. For example, for a silicon substrate, stress-generating regions may be formed at both sides of the gate structure on or in the substrate to produce so-called "strained Si channel." The choice of stress-generating material for an N-channel or a P-channel generally differs, and thus the NMOS region and the PMOS region must be processed separately. As a result, the heights of the hard mask layer of the gate structure on the NMOS region and the hard mask layer of the gate structure on the PMOS region are different. To balance the height difference, an additional wet dip process is required, which in turn, may damage the gate material if the hard mask layer disposed at the top of the gate structure or the spacer disposed at the sidewalls of the gate structure does not have sufficient resistance against the etching solution of the wet dip process. It is therefore an important issue to select the material for the hard mask and the spacer.

SUMMARY

The present invention provides a semiconductor structure from which a gate structure with an ideal profile can be fabricated. The present invention also provides a method of fabricating a MOS device with an improved yield.

The present invention is directed to a semiconductor structure including a gate structure, a first spacer, and a second spacer. The gate structure is formed on a substrate and includes a gate material layer, a first hard mask layer disposed on the gate material layer, and a second hard mask layer disposed on the first hard mask layer. The first spacer is disposed on sidewalls of the gate structure. The second spacer is disposed adjacent to the first spacer. The etch rate of the first hard mask layer, the etch rate of the first spacer, and the etch rate of the second spacer are substantially the same and significantly smaller than the etch rate of the second hard mask layer in a rinsing solution.

In an embodiment, the first hard mask layer, the first spacer, and the second spacer includes SiCN, respectively; the second hard mask layer includes $SiO_2$; the rinsing solution includes sulfuric acid.

In an embodiment, the gate material layer includes polysilicon.

In an embodiment, stress-generating layers are disposed respectively in the substrate at both sides of the gate structure.

In an embodiment, the stress-generating layers includes SiGe.

The present invention is directed to a method of fabricating a MOS device including the following steps. A gate structure, a first spacer, and a second spacer are formed on a substrate, wherein the gate structure includes a gate material layer, a first hard mask layer is disposed on the gate material layer, and a second hard mask layer disposed on the first hard mask layer, the first spacer is disposed on sidewalls of the gate structure, and the second spacer is disposed adjacent to the first spacer. The substrate is then rinsed with a rinsing solution, wherein the etch rate of the first hard mask layer, the etch rate of the first spacer, and the etch rate of the second spacer are substantially the same and significantly smaller than the etch rate of the second hard mask layer in the rinsing solution.

In an embodiment, the method of fabricating a MOS device further includes the following steps. A planarized dielectric layer exposing the first hard mask layer is formed. The first hard mask layer is removed. The gate material layer is removed to form a trench in the planarized dielectric layer. A metal gate is formed in the trench.

In an embodiment, the first hard mask layer is removed by a dry etching process.

In an embodiment, the method of fabricating a MOS device further includes forming a high-k dielectric layer in the trench after removing the gate material layer and before forming the metal gate.

In an embodiment, the method of fabricating a MOS device further includes forming a high-k dielectric layer on the substrate before forming the gate structure, wherein the gate material layer is subsequently formed on the high-k dielectric layer.

Accordingly, the present invention provides a semiconductor structure and a method of fabricating a MOS device. The semiconductor structure has a gate material layer, a double hard mask structure disposed thereon, and a double spacer structure disposed adjacent to the gate material layer. The gate material can be well protected by the bottom hard mask and the spacers. The ideal profile of the gate structure leads to an enhanced yield of the fabrication process.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 1A-1I are schematic cross-sectional views illustrating a method of fabricating a MOS device according to an embodiment of the invention.

Figure 1A:
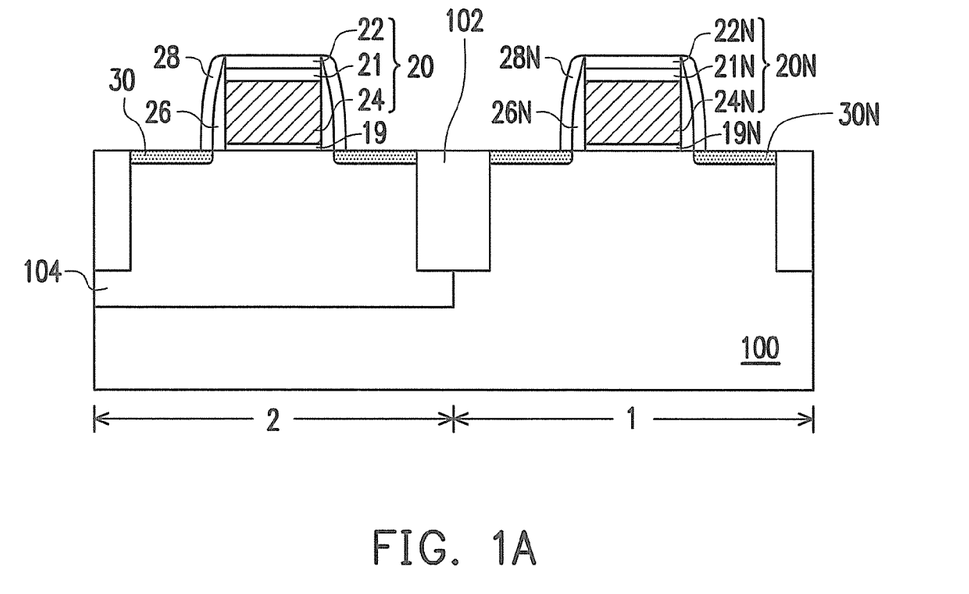
FIGS. 1A-1I are schematic cross-sectional views illustrating a method of fabricating a MOS device according to an embodiment of the invention.

Referring to FIG. 1A, a substrate 100 such as a silicon substrate, a silicon-containing substrate, or a silicon-on-insulator (SOI) substrate is provided. The substrate 100 has a region 1 and a region 2 disposed therein. An isolation structure 102 such as shallow trench isolation (STI) is formed in the substrate 100 between the region 1 and the region 2, providing electrical isolation therebetween. In this embodiment, the substrate 100 may be a P-type substrate and an N-well 104 is formed in the region 2. In the subsequent fabrication processes, an NMOS can be formed in the region 1, and a PMOS in the region 2.

Continue referring to FIG. 1A, a gate structure 20 is formed on the N-well 104, and a gate structure 20N is formed on the region 1. The gate structure 20 includes a dielectric layer 19, a gate material layer 24, a hard mask layer 21, and a hard mask layer 22 formed bottom to top. The dielectric layer 19 can include silicon oxide ($SiO_2$). The gate material layer 24 includes, for example, polysilicon or amorphous silicon. Material of the hard mask layer 21 is, for example, silicon carbonitride (SiCN). Material of the hard mask layer 22 is, for example, $SiO_2$, or, the hard mask layer 22 can be a stacked structure including a silicon nitride ($SiN_X$) layer and a $SiO_2$ layer disposed thereon. The hard mask layer 22 can be used as a barrier, resisting the etching of chemicals in the later processes. The hard mask layer 21, on the other hand, can serve as a CMP (chemical-mechanical planarization) stop layer in the later processes. A dielectric layer 19N, a gate material layer 24N, a hard mask 21N and a hard mask 22N can be formed simultaneously and be made of the same or similar material as the corresponding ones on the region 2. The gate structures 20 and 20N may be formed by methods or processes known to a person having ordinary skills in the art. The details are thus omitted here for brevity.

A spacer 26 is disposed on sidewalls of the gate structure 20, and a spacer 26N is disposed on sidewalls of the gate structure 20N. After the formation of the spacer 26, source and drain extension regions 30 are disposed in the region 2 and can be formed by performing an ion implant process using a mask (not shown) covering the region 1. After the formation of the spacer 26N, source and drain extension regions 30N may also be formed by an ion implant process using another mask (not shown) covering the region 2. In this embodiment, the dopant of the ion implant process for source and drain extension regions 30 can be boron (B) or gallium (Ga), and the source and drain extension regions 30 are p-type lightly doped drains (LDDs). The dopant of the ion implant process for source and drain extension regions 30N can be arsenic (As) or phosphorous (P), and the source and drain extension regions 30N are n-type lightly doped drains (LDDs).

A spacer 28 is disposed adjacent to the spacer 26, and spacer 28N is disposed adjacent to the spacer 26N. The spacer 28 and spacer 28N can be formed after the formation of the Source and drain extension regions 30 and 30N. The etch rate of the hard mask 21, the etch rate of the spacers 26 and 26N, and the etch rate of the spacers 28 and 28N in a rinsing solution are substantially the same, and significantly less than the etch rate of the hard mask layer 22 in the same rinsing solution. In an embodiment, both the material of the spacers 26 and 26N and the material of the spacers 28 and 28N are the same. In the present embodiment, the spacers 26, 26N, 28 and 28N can include SiCN or consist of SiCN. The spacers 26 and 26N can be formed by forming a spacer material layer on the substrate 100 by, for example, chemical vapor deposition, and then performing a dry etching process to remove the unnecessary part, leaving spacers 26 and 26N disposed on sidewalls of the gate structures 20 and 20N, respectively. The spacers 28 and 28N can be formed by a similar process.

Figure 1B:
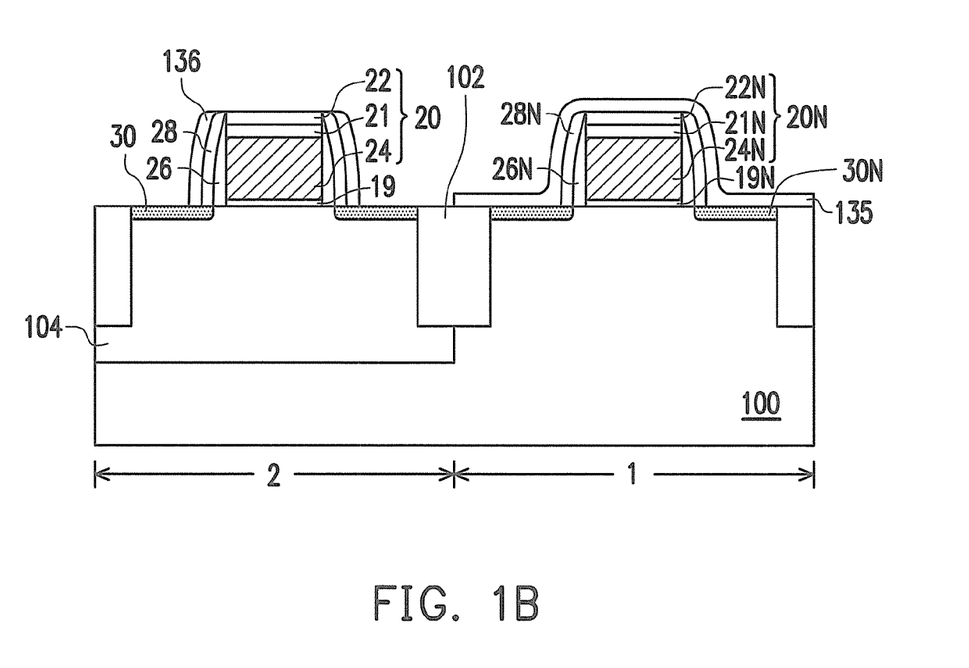

Retelling to FIG. 1B, a disposable material layer (not shown) are formed on the substrate 100 and subsequently subjected to an etching process with a mask layer (e.g. a photoresist layer, not shown) covering on the region 1 to form a disposable layer 135 on the region 1 and a disposable spacer 136 adjacent to the spacer 28. The mask layer is then removed.

Figure 1C:
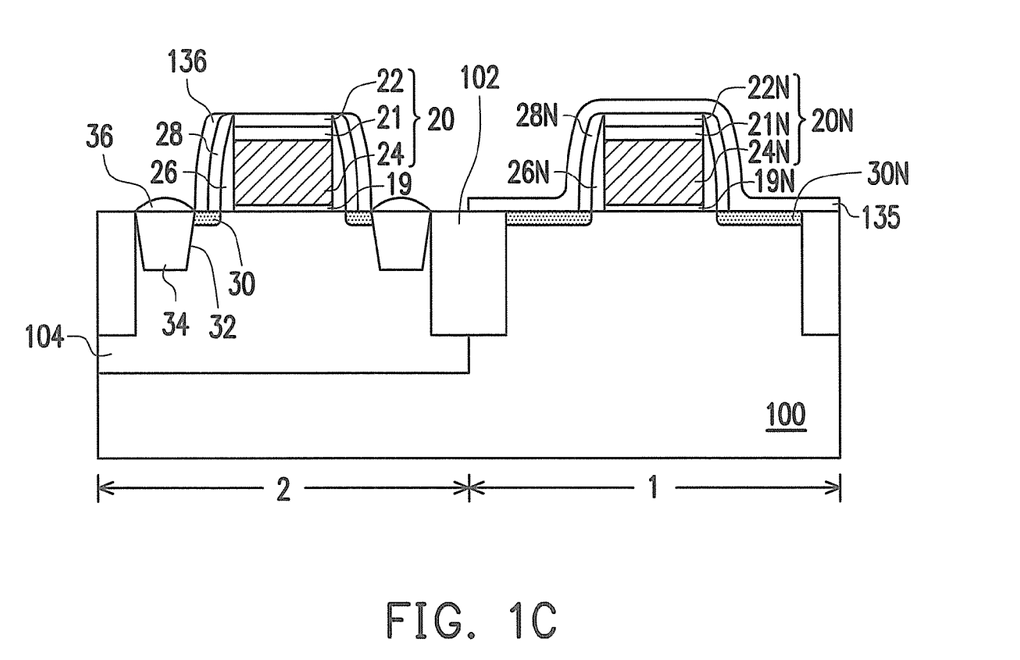

Referring to FIG. 1C, trenches 32 may be formed in the substrate 100 at both sides of the gate structure 20 by, a wet etching process, a dry etching process, or a combination thereof. A stress-generating material is then deposited into the trenches 32 to form stress-generating layers 34. For an p-channel in a silicon substrate, the stress-generating material can be SiGe. The SiGe deposition can be carried out by, for example, epitaxial growth. Specifically, each of the stress-generating layers 34 may be composed of an un-doped SiGe layer and a doped SiGe layer stacked in sequence. Silicon caps 36 may be subsequently formed on the stress-generating layers 34 by epitaxial growth, for later silicide formation. The disposable layers 135 and the disposable spacer 136 are removed afterwards.

Figure 1D:
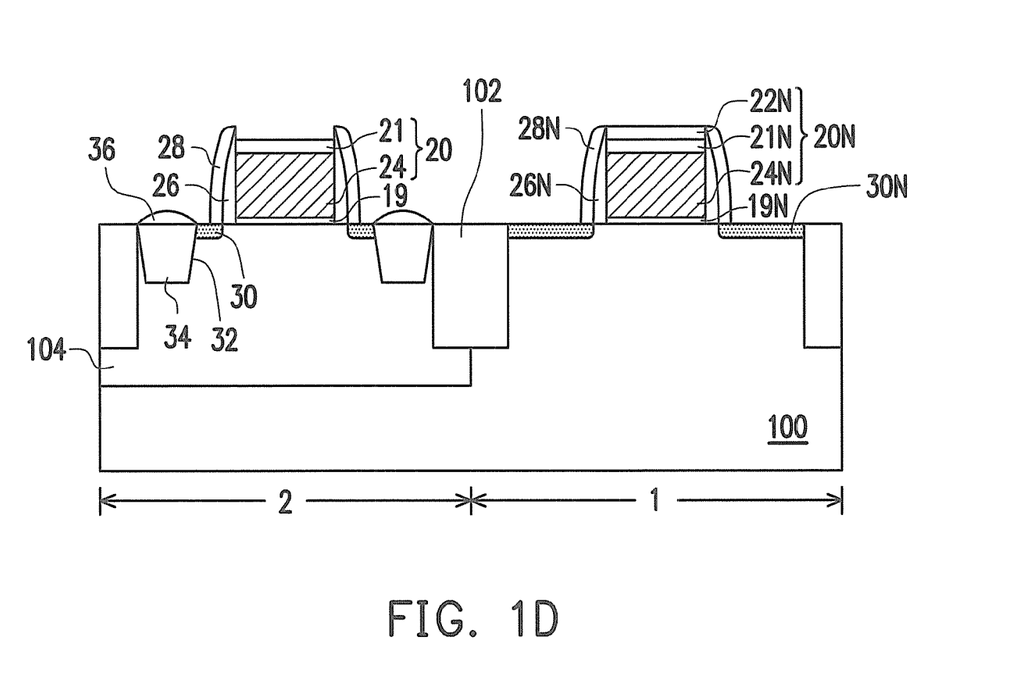

Cleaning processes are usually required between steps described above to remove the residuals (e.g. photoresist material, oxide, nitride, or contaminants caused by an etching process) on the substrate 100. A rinsing solution used in these cleaning processes can be sulfuric acid ($H_2SO_4$), which may, to a certain degree, damage the hard masks 22 and 22N. Therefore, after the formation of the stress-generating layers 34 and the remove of the disposable layer 135 and the disposable spacer 136, the hard mask 22 may be consumed and the hard mask layer 21 may be exposed, as shown in FIG. 1D. However, since the etch rate of the spacer 26 and the etch rate of the spacer 28 is far less than the etch rate of the hard mask layer 22 in the rinsing solution, the gate material layer 24 can be well protected by the hard mask 21 and spacers 26 and 28. The overall profile of the gate structure and the spacers 26 and 28 can thus remain adequate.

Figure 1E:
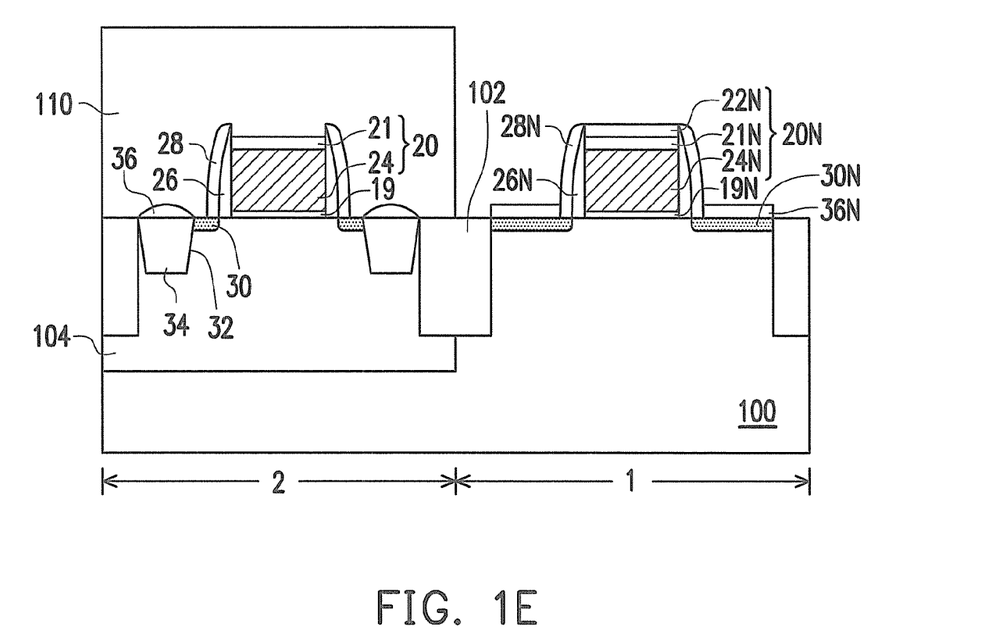

Now, referring to FIG. 1E, a mask layer 110 is formed on the region 2. The mask layer 110 can include a photoresist material. Silicon layers 36N are then formed on the region 1 by, for example, epitaxial growth. The silicon layers 36N may further be doped with phosphorous.

Figure 1F:
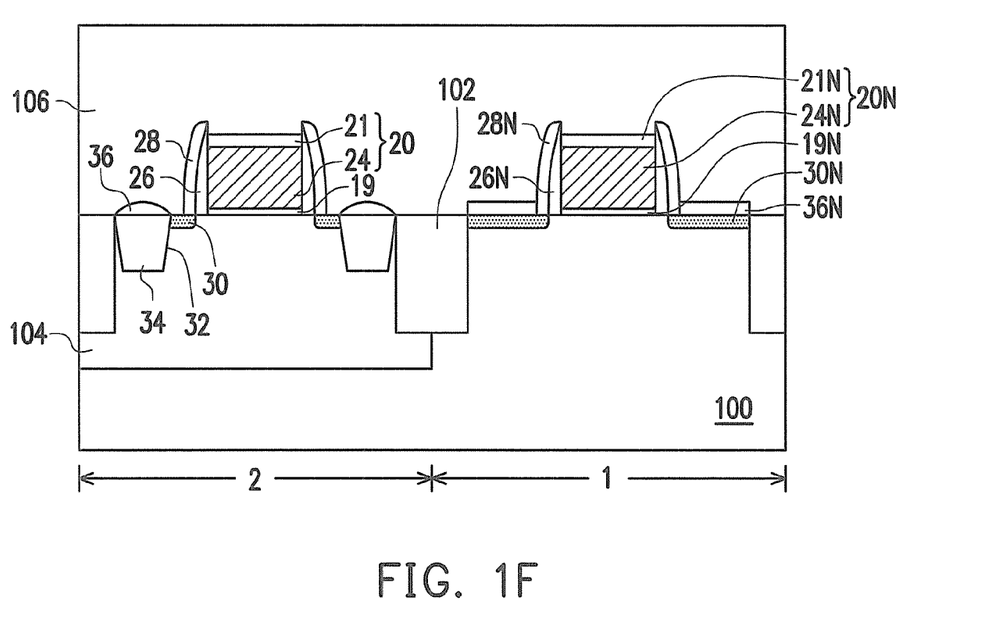

Referring to FIG. 1F, the mask layer 110 is removed. Note that hard mask layer 22N is consumed during these processes for the same reason discussed above. But the gate material layer 24N can still be well protected by the hard mask layer 21N, the spacer 26N, and the spacer 28N. A dielectric material layer 106 is then formed on the substrate 100, covering gate structures 20, 20N, as well as the space therebetween. The dielectric material layer 106 can include $SiO_2$, and the forming method thereof can be chemical vapor deposition.

Figure 1G:
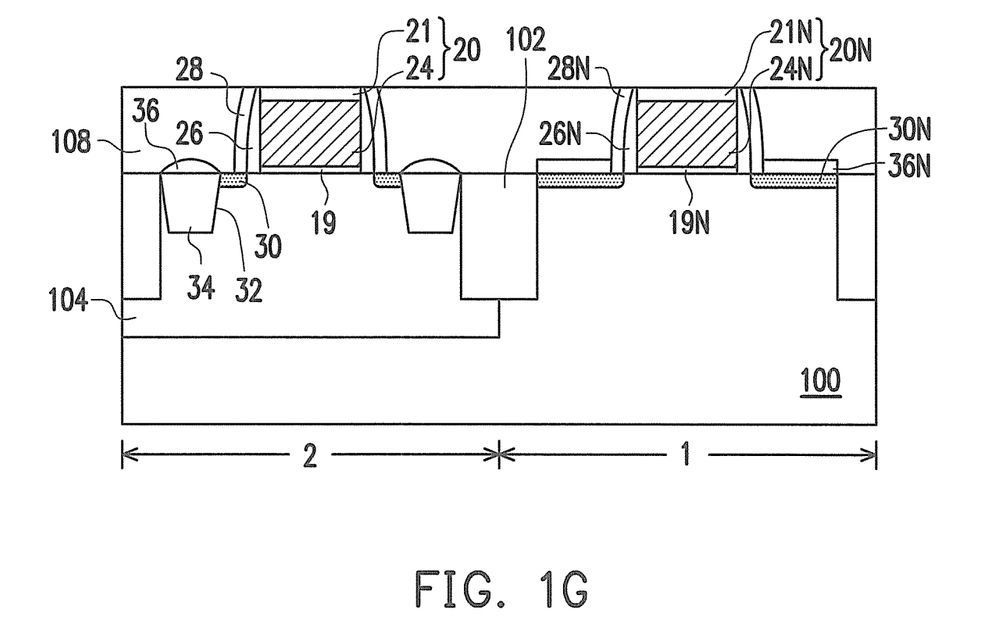

Referring to FIG. 1G, the upper portion of the dielectric material layer 106 is removed by a CMP process using the hard mask layers 21 and 21N as stop layers so as to form a dielectric layer 108 disposed between the gate structures 20 and 20N. The dielectric layer 108 may sometimes be referred to as inter-layer dielectric (ILD).

Figure 1H:
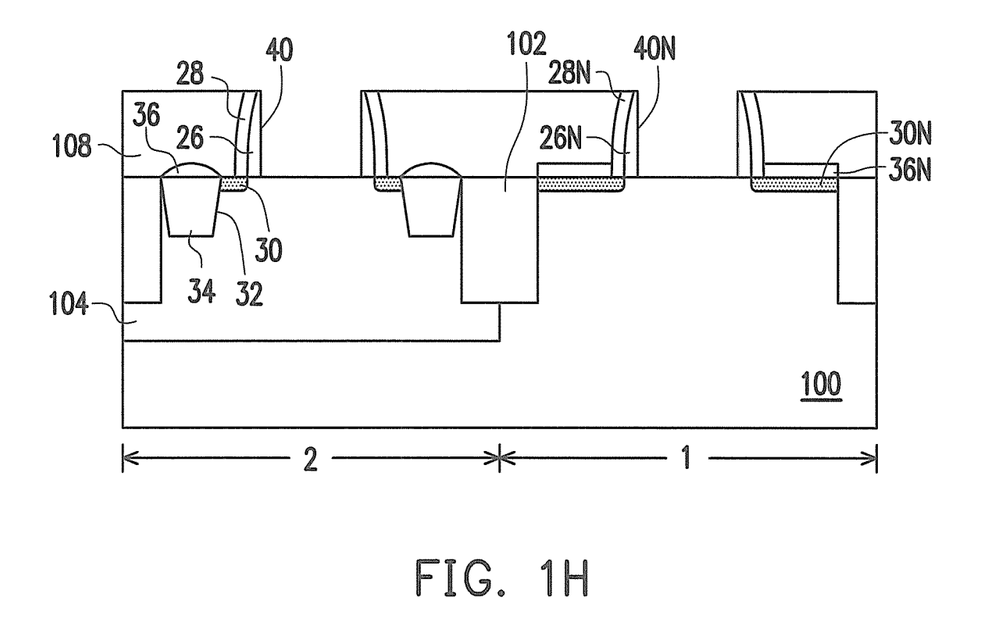

Referring to FIG. 1H, the hard mask layers 21 and 21N may be removed by, for example, a dry etching process. The gate material layers 24 and 24N may be subsequently removed by, for example, a wet etching process. The dielectric layer 19 and 19N may further be removed by, for example, a wet etching process to form trenches 40 and 40N on the region 2 and the region 1, respectively.

Figure 1I:
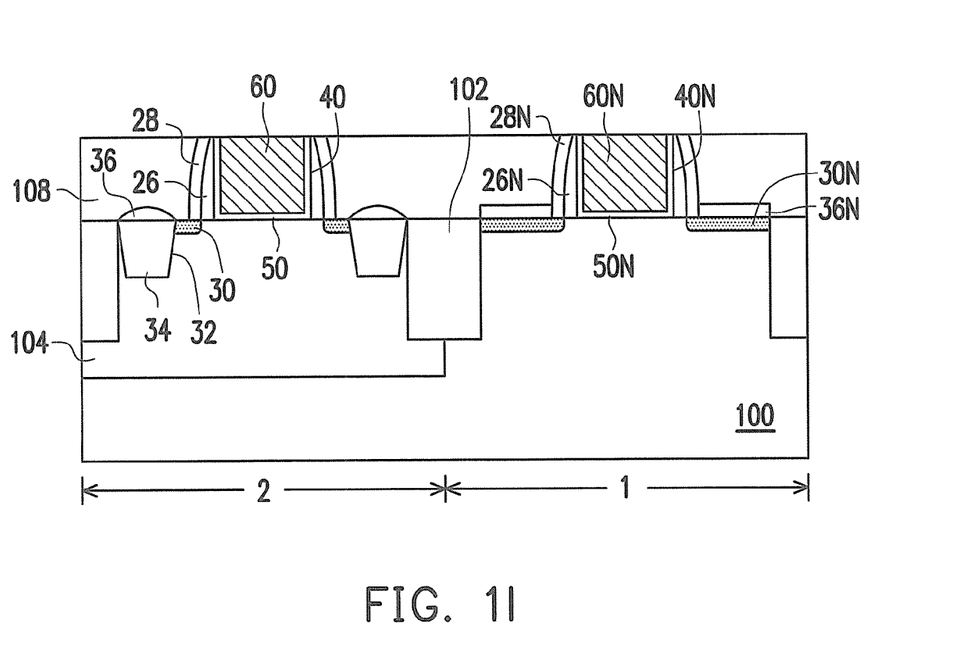

Then, referring to FIG. 1I, a high dielectric constant (high-k) material may be deposited into the trenches 40 and 40N to form high-k dielectric layers 50 and 50N. Thereafter, a metal material can be deposited on the high-k dielectric layers 50 and 50N to form metal gates 60 and 60N. The high-k material may have a dielectric constant greater than 4 and can be metal oxide, such as rare earth metal oxide. Specifically, the high-k material can be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), wherein x is between 0 and 1. Additionally, interfacial layers (not shown) can be formed respectively between the high-k dielectric layers 50 and 50N and the substrate 100. The interfacial layers can include silicon oxide.

Since the gate material layers 24 and 24N in the present embodiment are to be removed for the later gate (e.g. metal gate) formation, the gate material layers 24 and 24N are sometimes referred to as "dummy gate." It should be noticed that, the present embodiment is thus far described in the context of a "high-k last" process, in which the high-k dielectric material is formed after removing the dummy gate. However, the present invention is not limited thereto. In other embodiments, the present invention may be integrated with a "high-k first" process. In such embodiments, the dielectric layer 19 and 19N can be high-k material. The process flows are similar except that the high-k dielectric layer is formed prior to the formation of the dummy gate. The similar details thus will not be reiterated here.

Between the high-k dielectric layer and the metal gate, additional layers (not shown) for different purposes can be formed, such as a barrier metal layer, an etch stop layer, a work function metal layer, and a top barrier metal layer. For example, the work function metal layer is formed to modulate the threshold voltage of the MOS device, and the material thereof may be different for an NMOS and for a PMOS. All of these additional layers can be formed by methods or processes known to a person having ordinary skills in the art. The details are thus omitted for brevity.

In the present embodiment, the hard mask layers 21 and 21N, the spacers 26 and 26N, and the spacers 28 and 28N are made of the same material such as SiCN, while the hard mask layers 22 and 22N are made of $SiO_2$, $SiN_x$, or a combination thereof. SiCN has a great etch resistance against the rinsing solution used in the cleaning processes. Consequently, the gate material layers 24 and 24N can be well protected by the hard mask layers 21 and 21N and the spacers, even though the hard mask layers 22 and 22N are consumed in the cleaning processes. An ideal profile of the final gate structure can thus be obtained. Note this invention is not limited to the use of SiCN. In fact, any suitable material having a good etch resistance can be used.

For a better understanding of the present invention, the following illustrative explanation is given.

Figure 2A:
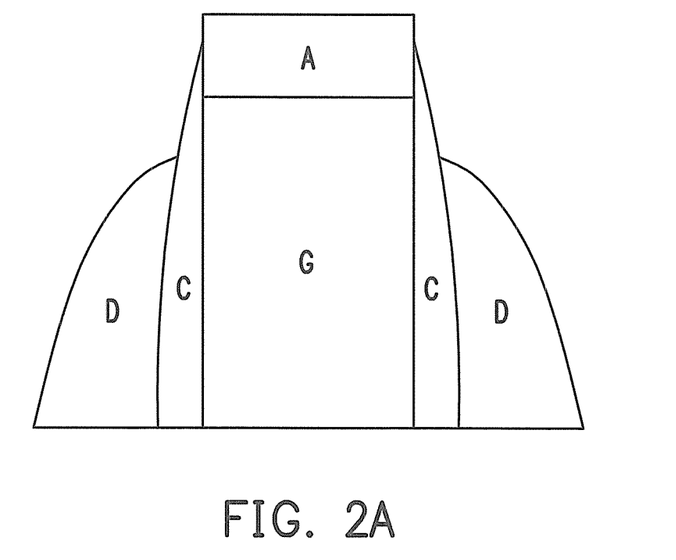
FIGS. 2A-2C are schematic cross-sectional views showing the profile of the gate structures and spacers of two comparative examples and an example of the invention after a wet dip process.
Figure 2B:
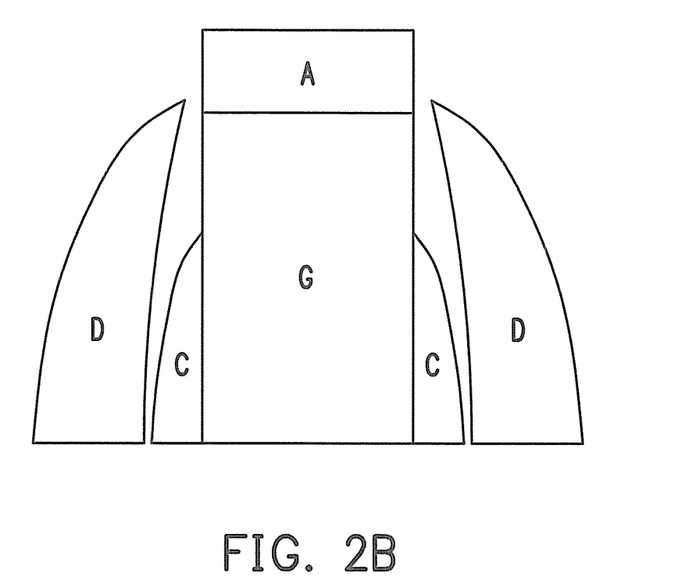
Figure 2C:
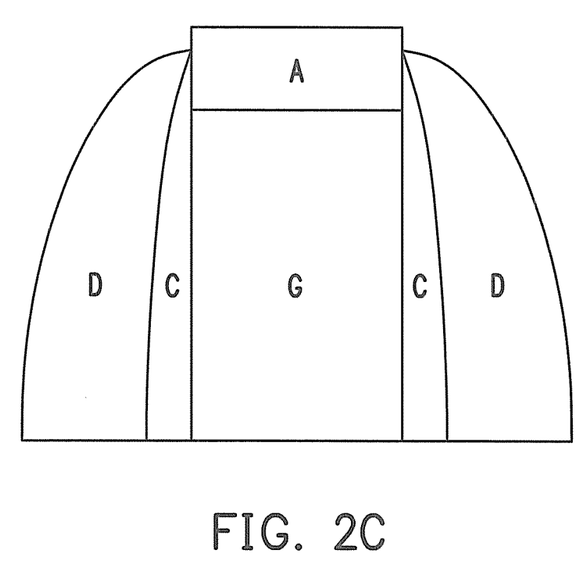

FIGS. 2A-2C are schematic cross-sectional views showing the profile of the gate structures and spacers of two comparative examples and an example of the invention after a cleaning process (e.g. a wet dip process).

Prior to the wet dip process, all of the three examples have the identical structure as the gate structures and the spacers depicted in FIG. 1A; that is, each of the structures includes a gate material layer G, a hard mask A disposed thereon, another hard mask disposed on the hard mask layer A, a spacer C disposed on sidewalls of the gate structure, and a spacer D disposed adjacent to the spacer C. The top hard mask has the weakest etch resistance against the rinsing solution, and thus is exhausted after the wet dip process. The final profile of the gate structure and the spacers depends on the etch rate of hard mask layer A ($ER_A$), the etch rate of the inner spacer C ($ER_C$), and the etch rate of outer spacer D ($ER_D$) in the rinsing solution.

Referring to FIG. 2A, a comparative example in which $ER_D > ER_C > ER_A$ is illustrated. The spacer D is etched more rapidly than the hard mask layer A and the spacer C, resulting in a non-uniform profile exposing the spacer C. Referring to FIG. 2B, a comparative example in which $ER_C > ER_D > ER_A$ is illustrated. The spacer C is etched more rapidly than the hard mask layer A and the spacer D, resulting in the exposure of the gate material layer G, which may be further damaged in the later processes. Both profiles illustrated in FIGS. 2A and 2B will impact the total yield of the fabrication process. On the contrary, referring to FIG. 2C, an inventive embodiment in which $ER_A = ER_C = ER_D$ is illustrated. This embodiment gives an ideal profile since the etch rates of hard mask layer A, spacer C, and spacer D are substantially the same.

Accordingly, the present invention provides a semiconductor structure and a method of fabricating a MOS device. The semiconductor structure has a gate material layer, a double hard mask structure disposed thereon, and a double spacer structure disposed adjacent to the gate material layer, wherein the top hard mask in the double hard mask structure has a significantly greater etch rate as compared to the other materials of the hard mask and spacer structure with respect to a rinsing solution. The top hard mask will be consumed in the fabrication processes, but the gate material can nevertheless be well protected by the remaining hard mask and the spacers. The ideal profile of the gate structure leads to an enhanced yield of the fabrication process.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of fabricating a MOS device, comprising:
   forming a gate structure on a substrate,
   the gate structure comprising a gate material layer, a first hard mask layer disposed on the gate material layer, and a second hard mask layer disposed on the first hard mask layer,
   forming a first spacer disposed on sidewalls of the gate structure;
   forming a second spacer disposed adjacent to the first spacer; and
   after the second spacer is formed disposed adjacent to the first spacer, removing the second hard mask layer by rinsing the substrate with a rinsing solution,
   wherein an etch rate of the first hard mask layer, an etch rate of the first spacer, and an etch rate of the second spacer are substantially the same and significantly smaller than an etch rate of the second hard mask layer in the rinsing solution.

2. The method of claim 1, further comprising:
   forming a planarized dielectric layer exposing the first hard mask layer;
   removing the first hard mask layer;
   removing the gate material layer to form a trench in the planarized dielectric layer; and
   forming a metal gate in the trench.

3. The method of claim 2, wherein the first hard mask layer is removed by a dry etching process.

4. The method of claim 2, further comprising forming a high-k dielectric layer in the trench after removing the gate material layer and before forming the metal gate.

5. The method of claim 1, further comprising forming a high-k dielectric layer on the substrate before forming the gate material layer, wherein the gate material layer is subsequently formed on the high-k dielectric layer.

6. The method of claim 1, wherein the step of the forming the second spacer disposed adjacent to the first spacer is performed when the second hard mask layer is still present on the first hard mask layer.

7. The method of claim 1, wherein the step of the forming the second spacer disposed adjacent to the first spacer is performed so that sidewalls of the second hard mask layer are covered by the second spacer and the first spacer.

8. The method of claim 1, wherein the step of forming the first spacer disposed on the sidewalls of the gate structure is performed, and sidewalls of the first spacer is exposed by the second hard mask layer.

* * * * *